(12) United States Patent
Stadlmann (10) Patent No.: US 11,179,892 B2
(45) Date of Patent: Nov. 23, 2021

(54) METHOD FOR PRODUCING A THREE-DIMENSIONAL BODY

(71) Applicant: Klaus Stadlmann, Vienna (AT)

(72) Inventor: Klaus Stadlmann, Vienna (AT)

(*) Notice: Subject to any disclaimer, the term of this patent is extended or adjusted under 35 U.S.C. 154(b) by 215 days.

(21) Appl. No.: 16/065,672

(22) PCT Filed: Dec. 21, 2016

(86) PCT No.: PCT/AT2016/060133
§ 371 (c)(1),
(2) Date: Jun. 22, 2018

(87) PCT Pub. No.: WO2017/106895
PCT Pub. Date: Jun. 29, 2017

(65) Prior Publication Data
US 2019/0016050 A1    Jan. 17, 2019

(30) Foreign Application Priority Data

Dec. 22, 2015   (AT) .............................. A 51097/2015

(51) Int. Cl.
*B29C 64/277* (2017.01)
*B29C 64/295* (2017.01)
*B33Y 10/00* (2015.01)
*B29C 64/124* (2017.01)
*B29C 64/393* (2017.01)
(Continued)

(52) U.S. Cl.
CPC .......... *B29C 64/277* (2017.08); *B29C 64/124* (2017.08); *B29C 64/295* (2017.08); *B29C 64/393* (2017.08); *B33Y 10/00* (2014.12); *B33Y 30/00* (2014.12); *G06F 30/00* (2020.01); *B33Y 50/02* (2014.12)

(58) Field of Classification Search
CPC .................................................... B29C 64/393
See application file for complete search history.

(56) References Cited

U.S. PATENT DOCUMENTS 5,460,758 A    10/1995 Langer et al.
6,813,082 B2*  11/2004 Bruns ................. B29C 35/0805
                                                        264/1.31
(Continued)

FOREIGN PATENT DOCUMENTS

EP    2 043 845 B1    10/2010
EP    2 173 538 B1    12/2012
(Continued)

OTHER PUBLICATIONS

Russian Examination Report for corresponding Russian Patent Application No. 2018123360/05(037023), dated Mar. 11, 2019, 6 pages.
(Continued)

*Primary Examiner* — Joseph A Miller, Jr.
(74) *Attorney, Agent, or Firm* — Merchant & Gould P.C.

(57) ABSTRACT

A method produces a three-dimensional body (3) in a stereolithographic process. According to the method, a photosensitive material (9) is cured by radiation, measuring radiation is coupled into a reference layer (80) and, as a result of internal reflection, remains predominantly within the reference layer (80), and the measuring radiation is detected space-resolved and time-resolved by a sensor (5).

13 Claims, 9 Drawing Sheets

(51) Int. Cl.
  *G06F 30/00* (2020.01)
  *B33Y 30/00* (2015.01)
  *B33Y 50/02* (2015.01)

(56) References Cited

U.S. PATENT DOCUMENTS

| | | | |
|---|---|---|---|
| 7,541,582 | B2 | 6/2009 | Ouvrier-Buffet et al. |
| 8,149,389 | B2 | 4/2012 | Bohl |
| 2002/0197731 | A1* | 12/2002 | McFarland ............. C40B 50/14 436/171 |
| 2004/0211917 | A1* | 10/2004 | Adamovics ............... G01T 1/06 250/474.1 |
| 2005/0095353 | A1* | 5/2005 | Isele ........................ C08J 3/248 427/8 |
| 2009/0180118 | A1* | 7/2009 | Feichtinger ............. F27D 21/02 356/402 |
| 2009/0267269 | A1* | 10/2009 | Lim ..................... B29C 64/135 264/401 |
| 2010/0173096 | A1* | 7/2010 | Kritchman ............ B29C 64/112 427/553 |
| 2012/0061864 | A1* | 3/2012 | Akashi ............. B29D 11/00355 264/1.36 |
| 2015/0165678 | A1 | 6/2015 | Ding et al. |

FOREIGN PATENT DOCUMENTS

| | | |
|---|---|---|
| RU | 2 386 934 C2 | 4/2010 |
| RU | 2 464 587 C2 | 10/2012 |
| WO | 02/36331 A2 | 5/2002 |
| WO | 2009/025845 A1 | 2/2009 |
| WO | 2015/108547 A2 | 7/2015 |

OTHER PUBLICATIONS

International Search Report and Written Opinion of the International Searching Authority for International Patent Application No. PCT/AT2016/060133 dated Apr. 11, 2017, 14 pages.
Extended European Search Report for European Patent Application No. 21151984.8 dated Apr. 16, 2021, 6 pages.

\* cited by examiner

METHOD FOR PRODUCING A THREE-DIMENSIONAL BODY

This application is a National Stage Application of PCT/AT2016/060133, filed 21 Dec. 2016, which claims benefit of Serial No. A 51097/2015, filed 22 Dec. 2015 in Austria, and which applications are incorporated herein by reference. To the extent appropriate, a claim of priority is made to each of the above-disclosed applications.

BACKGROUND OF THE INVENTION

The invention refers in general to a stereolithography apparatus for producing a three-dimensional body by curing a photosensitive material layer by layer, and it also refers in general to a method for accelerating the production process by a space-resolved and time-resolved measuring technique; wherein the apparatus comprises the following:
  a reference layer;
  a radiation source for generating the specific radiation required for the curing;
  a sensor; and
  at least one passive radiation source for generating a measuring radiation.

The invention refers in particular to a method for producing a three-dimensional body in a stereolithographic process, wherein a photosensitive material is cured by radiation.

In stereolithography systems, see for instance EP 2 173 538 B1, a photosensitive fluid is transformed into a layer of a three-dimensional body under the effect of a suitable radiation, e.g. ultraviolet radiation. The invention deals with the acceleration of such a stereolithographic process by an optical measuring method which can be used in such a system.

Stereolithography usually is understood to mean a process which allows to produce a three-dimensional body by arranging individual layer formations next to each other. Said basic principle is also known under the names of rapid prototyping, 3D printing, additive manufacturing, etc.

Apart from controllable laser sources, also radiation sources are employed in stereolithographic processes, said radiation sources creating the layer formation by the use of digital mask exposure systems, so-called MEMS or DLP chips, or displays. The advantage of pixel-based exposure systems lies in the fact that the entire layer formation is produced all at once, whereas in case of laser-based systems the laser beam has to move along the geometry of the layer. In this connection, the curing of the photosensitive material takes place on a reference layer or reference plane: this can be the surface area of a base or another suitable defined area, and depending on the application it can have a solid, flexible or fluid form. After the solidification of a layer, said layer has to be separated from the reference layer as carefully as possible by a relative movement between the reference layer and a carrier area to which the created layer shall adhere. After the successful separation of the created layer, a new material which is well suited for solidification is fed in between the reference layer and the most recently formed layer; this can for instance be ensured by a simple lifting movement of the carrier area. Then the photosensitive material that has flown thereinto can again be cured by radiation. In order to create the desired three-dimensional object, the described individual method steps will be repeated until all layers required for the formation of the body or the object will have been generated.

The drawbacks of such a stereolithography process are the long process times and waiting times which arise during the separation of a layer. Said times constitute a large part of the entire process time. Furthermore it is disadvantageous that exposure errors cannot be detected, and that it may happen that there will be no adherence to the carrier area; also the setting of the starting position as well as of the zero position of the system is problematic.

From prior art there is known to integrally measure the pull-off forces in a stereolithography process during the separation of the created layer from the reference layer at the carrier platform. One example of such a method is described in EP 2 043 845 B1, wherein a force sensor is fixed at a construction platform or a carrier platform. Said sensor enables the measurement of the pull-off forces occurring during the detachment of an only just formed component layer or of the component from a reference layer. Thereby, the construction process can be accelerated. The force sensor described in EP 2 043 845 B1—which can for instance be implemented as strain gauges—measures in the described arrangement the sum of the forces generated at the produced layers during removal thereof. In this connection it is disadvantageous that only the sum of the forces occurring during the separation of several component layers can be detected, but not the separation force of a certain component or a certain layer. It is also only possible to measure the totally occurring separation force as a function of time. Furthermore, it is also not possible to make any statements on and draw any conclusions about the dependency of the force on the layer geometry of an individual body, and, thus, also no statement can be made with regard to the fact whether in case of the simultaneous production of several bodies all bodies will actually be constructed reliably and completely. Moreover, in the known methods no conclusions can be drawn with regard to the polymerization process of the layer or of the body.

SUMMARY OF THE INVENTION

Hence, the object of the invention is to eliminate the above-mentioned disadvantages and to enable a simple, quick, trouble-free, continuous, economic as well as self-checking production of three-dimensional bodies by means of an improved technique (apparatus, method).

In particular, it is the object of the invention to provide a method of the kind mentioned at the beginning, in which an exact statement on the process status is continuously possible, and in which the simultaneous production of several bodies in a stereolithographic process is facilitated, wherein also the status of the individual processes or produced bodies/layers is enabled, respectively. In more detail, it shall be possible to sense an interaction between a reference area/layer and the layers respectively formed.

According to the invention, the present method for producing a three-dimensional body is characterized above all by the fact that a measuring radiation is coupled into a reference layer and, as a result of internal reflection, predominantly remains within the reference layer, and that the measuring radiation is detected space-resolved (or locally resolved) and time-resolved by a sensor. By proceeding in this way it is possible to continuously monitor and sense the layer production process—and consequently the 3D printing method or its progress—practically selectively or area by area, and, in doing so, in particular to also avoid unnecessary waiting times.

In this connection it is of particular advantage if by the deformation of the reference layer the internal reflection is disturbed, wherein measuring radiation will emerge from the reference layer. In this manner, a particularly exact detection of the progress of the process, in particular also area-wise, is possible.

In order to improve the measurement, it is further favorable if the sensor measures the emerging measuring radiation in several measuring areas at the same time.

For the implementation of the measurement it is also advantageous if the reference layer is flexible and at least partially transparent for the measuring radiation. In consequence of the flexible formation of the reference layer, a deformation of said reference layer will result under the impact of forces, whereby the measuring radiation is influenced with respect to an exact measurement.

Particularly advantageous results can further be obtained if the reference layer consists of silicone. For carrying out the measurement it is also favorable if a total reflection occurs within the reference layer.

A particularly advantageous embodiment of the present method is after all characterized by the fact that an infrared radiation is used as a measuring radiation. If, thus, the sensor is additionally adapted to measure the heat radiation occurring during solidification of a layer of at least one body on the reference layer, the curing can be controlled in an advantageous manner.

In the present method or in the pertaining stereolithography apparatus at least two measuring radiation sources, i.e. passive radiation sources, and at least one associated measuring sensor can be provided.

Furthermore, according to the invention conclusions can be drawn at least qualitatively about the presence of an intermediate phase within the photoreactive substance by the detection of the coupled-out, location and time dependent measuring radiation from the reference layer. Said intermediate phase which—by at least one inhibitor (e.g. oxygen)—does at least partially have no or only a very small reactivity, forms a kind of an "inert" lubricating film. Thereby the adhesive forces normally occurring during the process can be reduced to a large extent and/or can be reduced almost completely. As the emerging measuring radiation is related to the adhesive forces, by the inventive method conclusions can be drawn with regard to the presence of an intermediate phase in a space-resolved as well as time-resolved manner during the process.

BRIEF DESCRIPTION OF THE DRAWINGS

The invention will be explained hereinafter even further by means of preferred embodiments and by reference to the drawings. In the drawings, in detail and in schematic form there is shown in.

DETAILED DESCRIPTION OF THE PREFERRED EMBODIMENT

Figure 1:
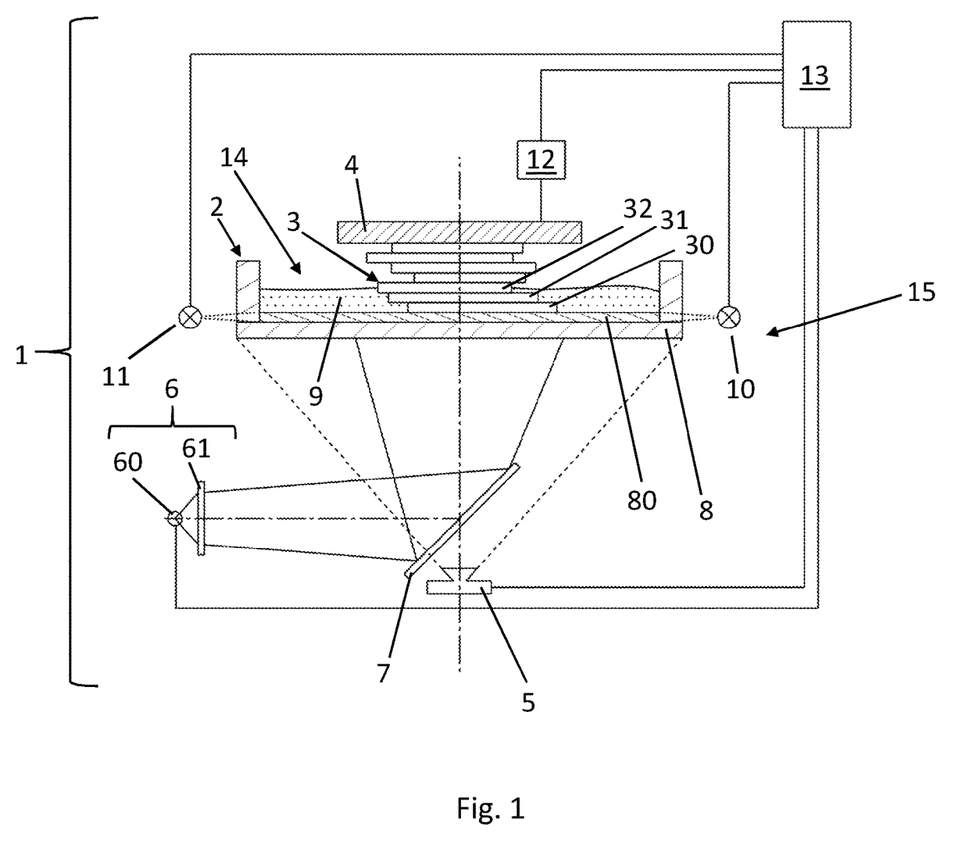
FIG. 1 a schematic view of an example of a stereolithography system for the illustration of the present method.

FIG. 1 shows as an example an embodiment of a stereolithography system 1, partially in section, wherein said system 1 is used for the production of one or several three-dimensional bodies 3 (see also FIG. 2 to FIG. 4) from individual layers which are cured by an area-wise solidification by means of an actinic radiation of a photosensitive material 9 contained in a trough 2 which forms a receiving space 14. The photosensitive material 9 contained in the receiving space 14 is a fluid, wherein the term "fluid" here shall stand for fluids with any viscosity, including suspensions and pasty substances.

One or more passive radiation source(s) 10, 11 is/are arranged such that a radiation difference arising from the deformation of a reference layer 80 can be detected by at least one sensor 5. According to FIG. 1, a base 8 and the reference layer 80 inclusive of the pertaining walls form a trough 2 which serves as a receiving space 14 for the photosensitive fluid material 9. Here a "passive radiation source" shall mean such a radiation source which is used as a measuring means, wherein its radiation is not capable of solidifying the photosensitive material 9—neither by its intensity and/nor by the used wavelength. A controllable radiation source, in particular light source, 60 is for instance arranged below the trough 2, wherein the emitted ray of the light source 60 is deflected for instance by means of a mirror 7. Here, the mirror 7 can be designed such that it will only reflect the radiation of the light source 60, but is permeable to other wave length ranges. According to FIG. 1, there is arranged for instance an optical element 61, e.g. a lens, in front of the radiation source 60, and the radiation unit as a whole formed thereby is designated with 6. The radiation source 60 can for instance emit conventional light, but also IR or UV radiation.

A carrier area 4 can by moved by an actuator 12, for instance a stepping motor drive, with respect to the receiving space 14. The trough 2 is advantageously designed such that it will be exactly aligned with and centered with regard to the passive light source(s), e.g. 10, 11, as well as with regard to the radiation unit 6 when it is inserted into the stereolithography system, and that it can occupy a certain position with regard to the passive light source(s) being present in the system space 15, which position is favorable for the measuring method. Advantageously, also the sensor can occupy any position within the system space 15 which is useful for the measuring method. The trough 2 itself can also be adapted such that it is capable of deflecting the ray path of the passive light source(s) 10 and/or 11, see also FIG. 6, so as to enable for instance a space-saving arrangement of the passive light sources 10, 11 in a certain embodiment.

According to FIG. 1, the passive radiation is coupled into the reference layer 80 from the side in order to uniformly spread for instance by an internal total reflection (see FIG. 3) within the reference layer 80. A control unit 13, for instance a control computer, controls the movements of the carrier area 4 as well as the entire process sequences which are required for the production of the body 3 in the system 1, and also the light source 60 or 6, and it also captures the passive measuring radiation via the at least one sensor 5 in order to evaluate it.

Figure 2:
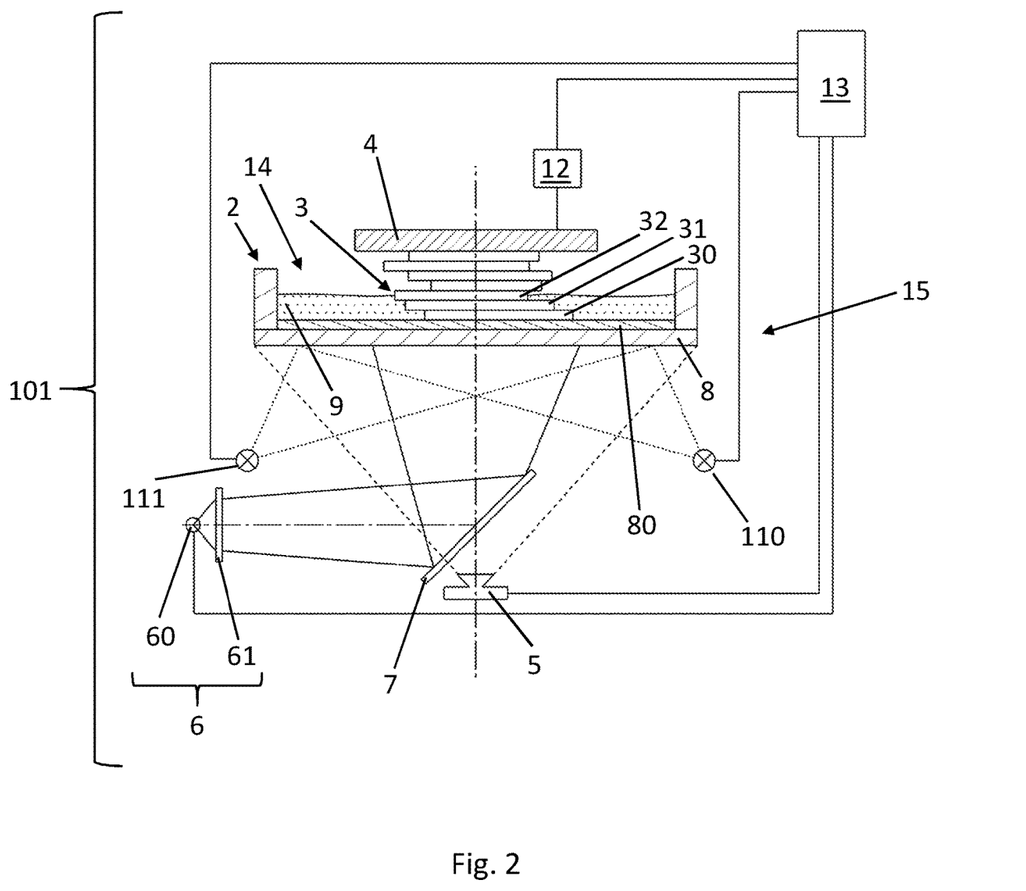
FIG. 2 a view of a stereolithography system modified in comparison therewith.

In contrast to FIG. 1, FIG. 2 shows a design variant of a stereolithography system 101 in which the passive radiation sources 110, 111 are situated below the trough 2 in the system space 15 and irradiate the bottom side of the trough 2 as well as preferably illuminate it uniformly. Here, the at least one sensor 5 is also positioned in the system space 15, and it detects the reflection or the stray radiation from the bottom side of the trough 2 which is formed at least by the reference area 80, if applicable also by a base 8. In said embodiment, the passive radiation is not necessarily coupled into the reference layer 80 or the trough 2, and the trough 2 does not have to be completely transparent for the passive radiation; there must only be provided a certain reflection ability of the reference layer 80 for the passive radiation.

In contrast to the embodiments according to FIG. 1 and FIG. 2, the system, e.g. 1, can also comprise a sensor 5 which is capable of detecting the exothermic solidification processes initiated by the radiation source 5. This then allows the at least partial detection of the polymerization state of the formed layer, e.g. 30, 31, 32, and it is also possible to draw conclusions about the possible separation process of the created layer, e.g. 30, 31, 32, by the reception of the radiation through the sensor 5.

Figure 3:
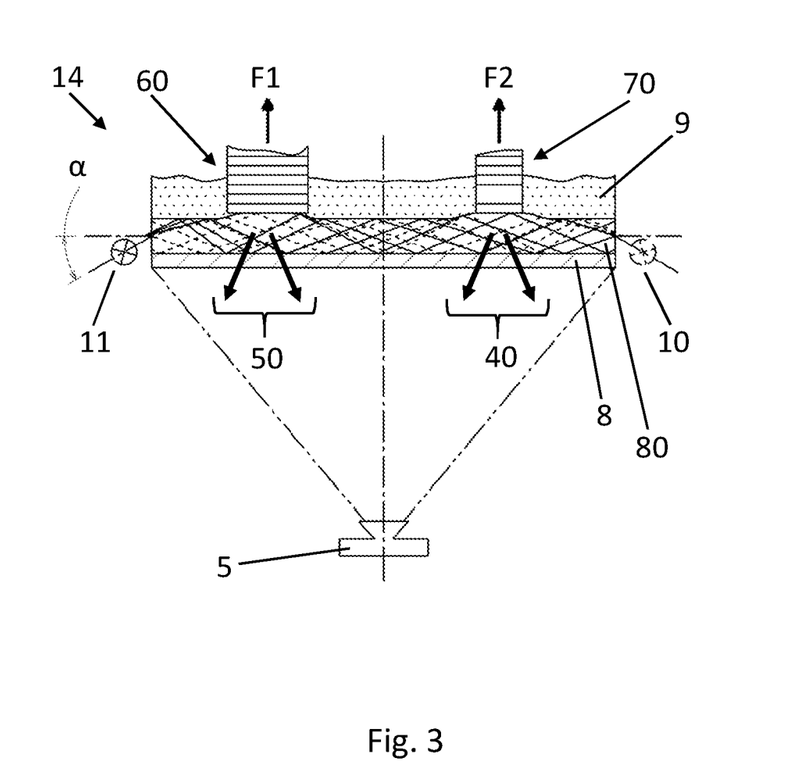
FIG. 3 a schematic diagram of an arrangement for the illustration of the measuring of a stray radiation.

FIG. 3 shows a detailed section through the receiving space 14 in which two bodies 60, 70 are produced. For a better understanding, in said FIG. 3 the reference layer 80 and the passive radiation of the passive radiation sources 10, 11 coupled thereinto and transported by internal total reflection are schematically represented by means of exemplary zigzag-shaped geometric ray paths. FIG. 3 also shows the deformation of the elastic reference layer 80 which is caused by separation forces F1 and F2 at the bodies 60 and/or 61. In this connection, the—optional—base 8 only serves as a support for the elastic reference area 80. In the shown representation, the separation forces F1 and F2 are different, as the body 60 has a substantially larger cross-sectional area than the body 70, and, thus, in the present example it applies that F1>F2, wherein as a result thereof also the deformation of the reference layer 80 is different.

Hence, by the different deformation also the total reflection within the reference layer 80 is disturbed as a function of the location, and, correspondingly, radiations 40, 50 are coupled out of the reference layer 80 in a certain relation to the respectively occurring separation force F1, F2. In this connection, for an optimum adjustment of the total reflection within the reference layer 80 the position of the passive light sources 10, 11 can be arranged for instance around an angle α in the system space 15, but of course the passive radiation sources 10, 11 can be positioned freely in all space coordinates. Here, the sensor 5 detects the position as well as the time-related behavior (the course of intensity) of the stray radiation 40 or 50 which is dependent on the respective force, e.g. F1 or F2.

Figure 3A:
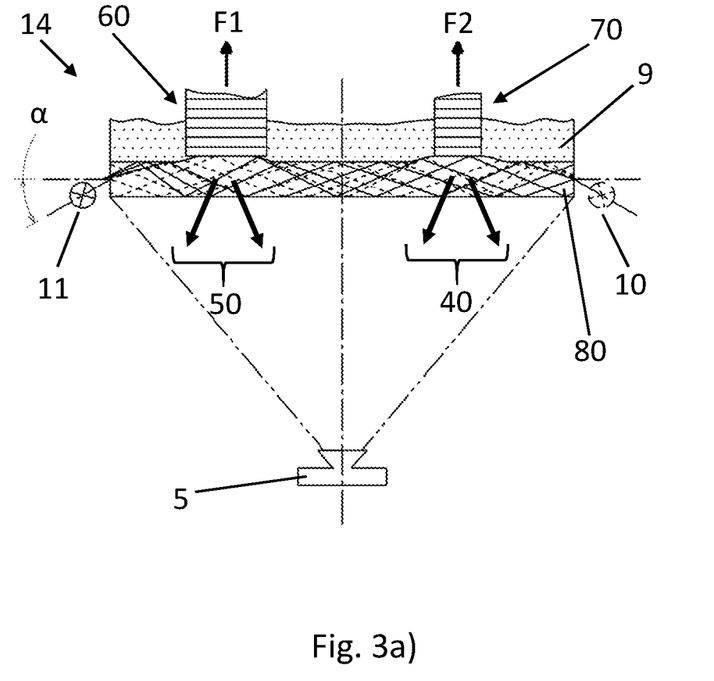
FIG. 3a an arrangement simplified in comparison with FIG. 3.

FIG. 3a shows an embodiment of the system 1 without a separate base 8 and also in a schematic sectional view. Here, the elastic reference layer 80 simultaneously constitutes the base of the trough 2. This has the advantage that the stray radiations 40, 50 as represented in said FIG. 3a are not decreased by a further layer. In addition, the reference layer 80 can be designed in its elasticity and thickness such that a desired carrying capacity of the trough 2 (in FIG. 1 and FIG. 2) for the photosensitive fluid 9 is obtained, and this in case of a simultaneous "membranous" behavior of the reference layer 80 which promotes the separation of the bodies 60, 70 and minimizes the separation forces F1, F2. For instance, by a thicker reference layer 80 a passive radiation can be coupled into said reference layer 80 more easily, and the position of the trough 2 or of the passive radiation sources 10, 11 within the system space 15 (see FIG. 2) may be adjusted in a less exact manner.

Figure 4:
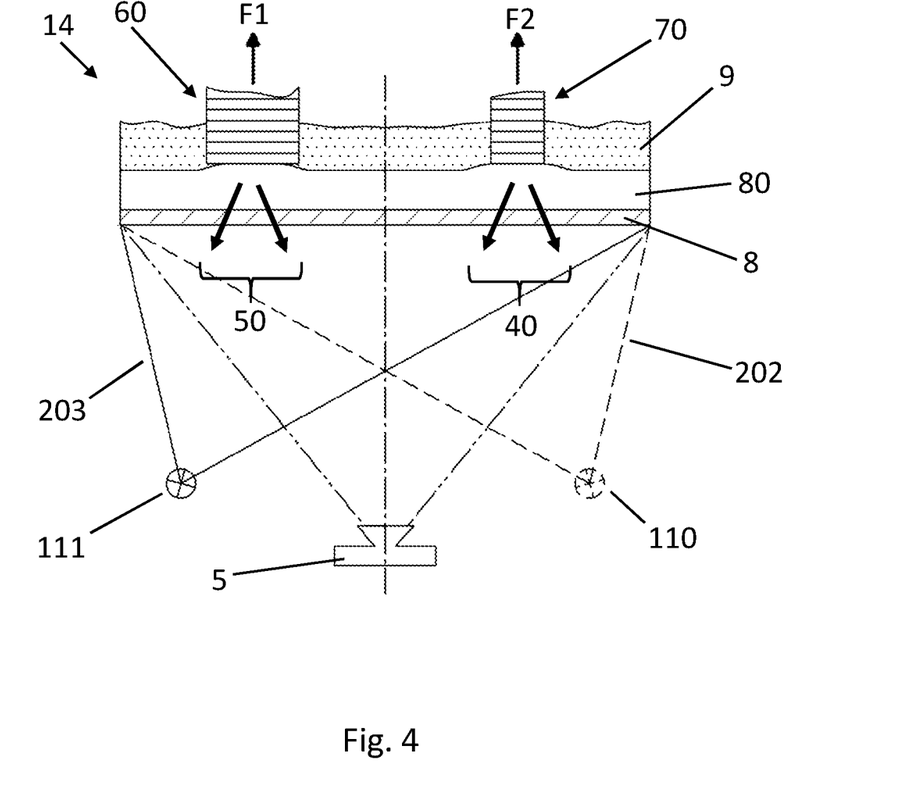
FIG. 4 a further embodiment with an altered position of the passive (measuring) radiation source.

FIG. 4 also illustrates a section through the receiving space 14 of a system in which the passive radiation sources 110, 111 are arranged below the trough 2 in a position in the system space 15 and more or less uniformly illuminate at least the reference layer 80 as well as the optional base 8. By the separation forces F1, F2 which are dependent on the cross-sectional area of the formed body/bodies 60 and/or 70, at least the elastic reference layer 80 will be deformed as shown. In the representation there is for instance once again illustrated that the body 60 has a larger cross-sectional area than the body 70, and therefore it can be assumed that the separation force F1 is larger than the separation force F2. By the separation forces F1, F2 the elastic reference layer 80 will be deformed once again in dependence on the location, and in accordance with the size of the deformation of at least the reference layer a change of the illumination by the passive radiation sources 110, 111 will follow. By the deformation there is effected a different time-related and location dependent reflection behavior of the trough 2 or of the reference layer 80 and/or of the base 8, which, in turn, can be detected by the sensor 5.

Figure 4A:
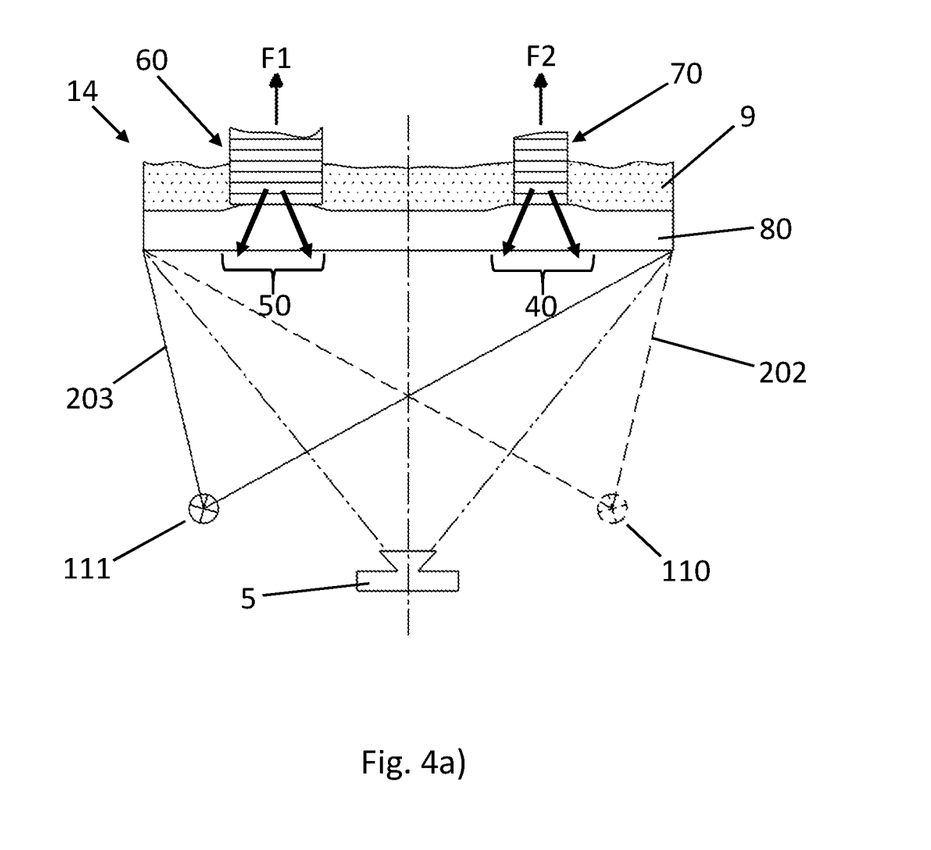
FIG. 4a the embodiment as represented in FIG. 4, but without a separate base.

FIG. 4a shows a design variant based on the system according to FIG. 4, wherein once again the base 8 was omitted, similarly to the case of FIG. 3a in relation to FIG. 3. Also here it has once again to be proceeded from the fact that the reference layer 80 is sufficiently solid in order to be able to carry the fluid 9 and the formed bodies 60, 70. Furthermore, similar to FIG. 4, the rays of the radiation sources 110 and 111 are schematically represented at 202 and 203. Finally, once again also the respective radiation 50 or 40 is illustrated.

Figure 5:
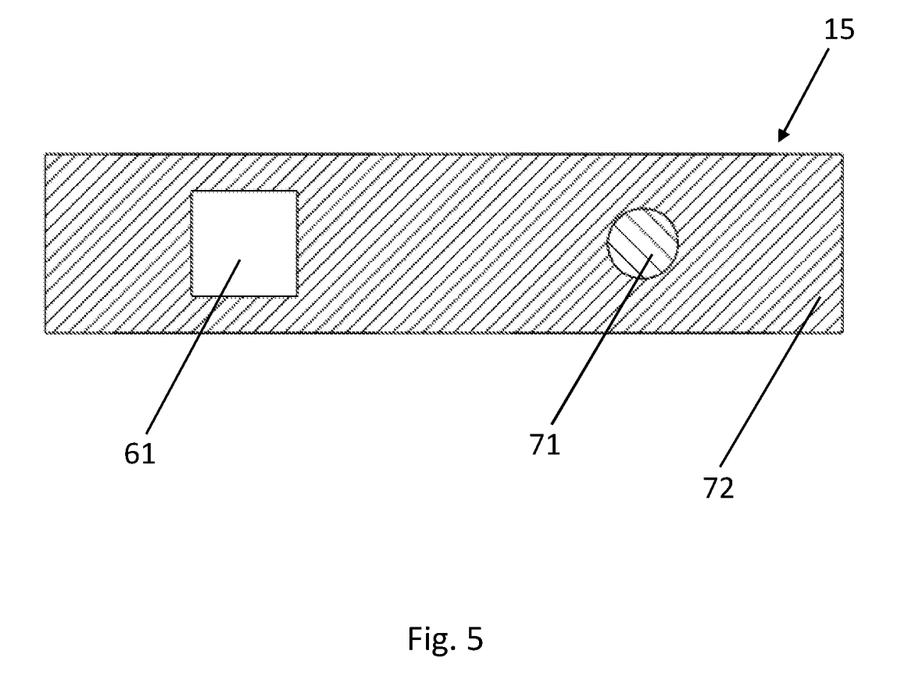
FIG. 5 schematically an example of a radiation information detected by the sensor.

FIG. 5 illustrates as an example a space- and time-dependent change of the intensity distribution of the passive radiation as detected by the sensor 5 and caused for instance by the impacts of the forces F1, F2 and the time and location dependent deformation resulting therefrom of the reference area 80 and, if applicable, also of the base 8 of the trough 2, by a radiation that is coupled out (see FIG. 3, FIG. 3a) or by a change of the reflection (see FIG. 4 and FIG. 4a) in the measuring space 15 that is sensed by the at least one sensor 5. In this connection, for instance in the area as sensed by the sensor 5 and in dependence on the occurring deformation of the elastic reference layer 80, there appear regions 61, 71 which depend on the different intensity distributions of the respective bodies 60, 70; said intensity distributions will be detected in a time- and space-(location-) dependent manner by the sensor 5 and they are related to the occurring separation forces F1, F2. When the sensor 5 is for instance implemented as an infrared camera and when an infrared radiation is used as a passive radiation, then the sensor 5 will capture a certain measuring area of the measuring space 15 as image information or video information which represents the geometric characteristic of the cross-sectional areas, an intensity distribution in accordance with the occurring separation forces F1, F2, either in predetermined time-resolved steps or continuously. Here, for instance in the regions 72 in which no or less deformation will occur, less passive radiation is detected by the sensor 5, and therefore they will appear in a darker color in the total image that is captured by the sensor 5 than e.g. the regions 61, 71 in which a deformation of the elastic reference layer 80 occurs.

It goes without saying that the person skilled in the art can readily make various modifications and amendments on the basis of the embodiments of the invention as disclosed herein.

Figure 6:
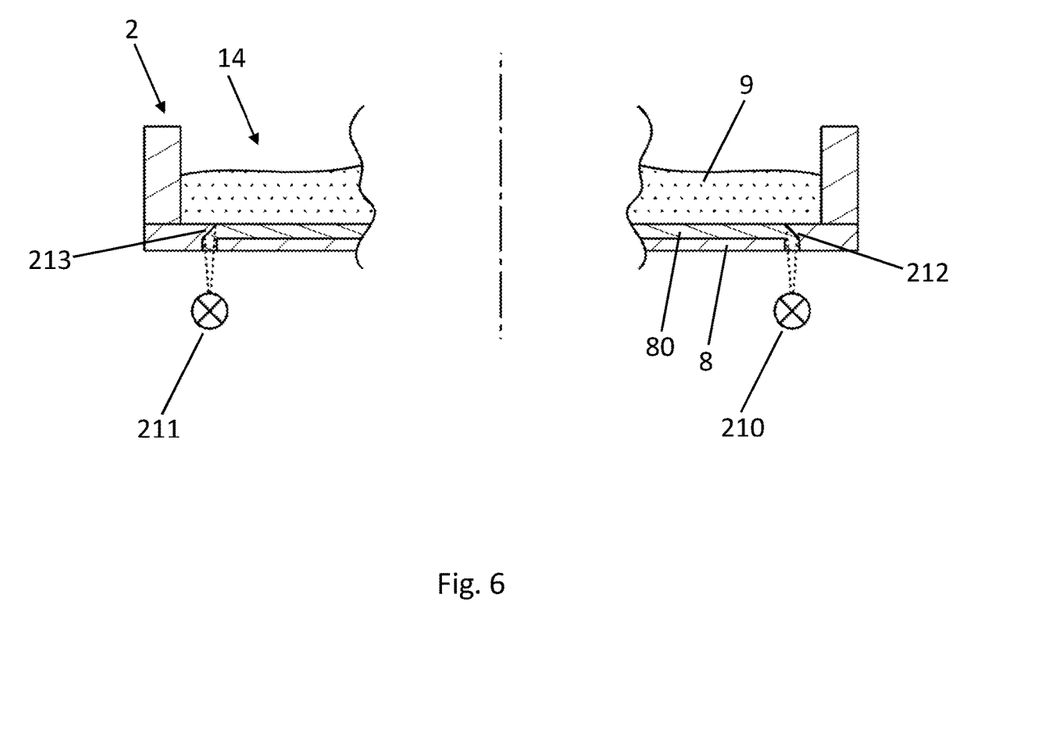
FIG. 6 schematically a section through a part of a system, with a modified measuring arrangement.

In FIG. 6 there is shown schematically, with a partially illustrated trough 2, an embodiment in which radiation sources 210, 211 provided below the trough 2 couple a radiation upwards into the base 8 of the trough 2, which base 8 in turn is constituted again by the reference layer 80. In said reference layer 80, in the ray path of the radiation sources 210, 211 there are attached or formed obliquely arranged mirrors or light conducting elements 212 or 213 which are preferably made directly from the material of the reference area, in order to deflect the measuring radiation emitted by the radiation sources 207, 211 and to thereby couple said radiation into the base 8 or the reference layer 80. Even if this is not illustrated in detail in FIG. 6, said coupling thereinto can once again, similar as in FIG. 3, be carried out at an angle so that a total reflection of the reference layer 80 is obtained (not illustrated in FIG. 6).

Besides, once again a sensor 5 can be provided at the bottom side, as is shown in FIG. 1 through FIG. 5, and also a control unit 13 can be attached, as is shown in FIG. 1 and FIG. 2.

Figure 7A:
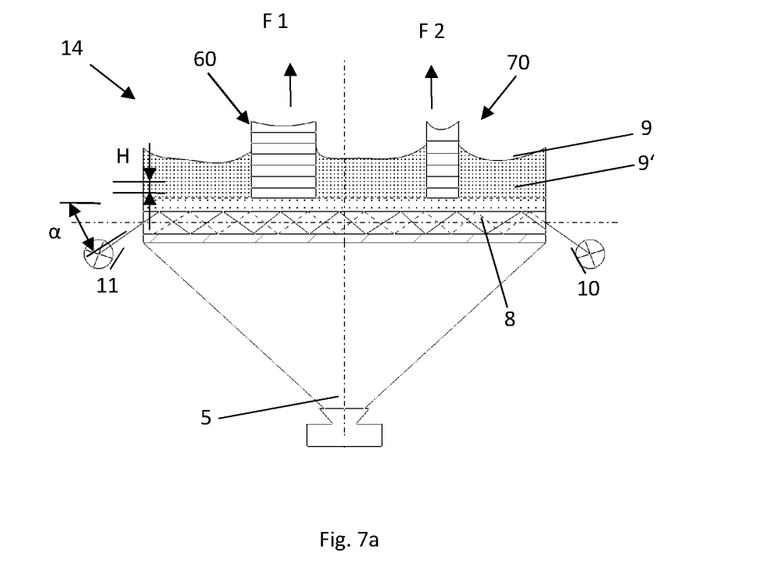
FIG. 7a a schematic diagram of a measuring arrangement for the determination of the presence of an intermediate phase, wherein it can for instance be assumed that the forces are very small.

FIG. 7a shows a detailed section through a receiving space 14 in which two bodies 60, 70 are produced. The photosensitive material 9 comprises an intermediate phase 9' as is shown in FIG. 7a. Said intermediate phase 9' has a reduced reactivity compared to the material 9. Said reactivity difference—which leads to the formation of the intermediate phase 9' in the photoreactive material 9—can for instance be obtained by chemical inhibitors, as for instance oxygen. Here, as is shown in FIG. 7a, the thickness H of the intermediate layer 9' has such a value (for instance 30, 50, 100 micrometers, etc.) that the intermediate layer 9' prevents the generation of the separation forces F1, F2 at least as far as possible, if it will not suppress/prevent this formation completely. By the absence of the separation forces, in the ideal case there will not take place any coupling-out of measuring radiation. Thus, a conclusion about the presence of a sufficient intermediate layer can be drawn.

Figure 7B:
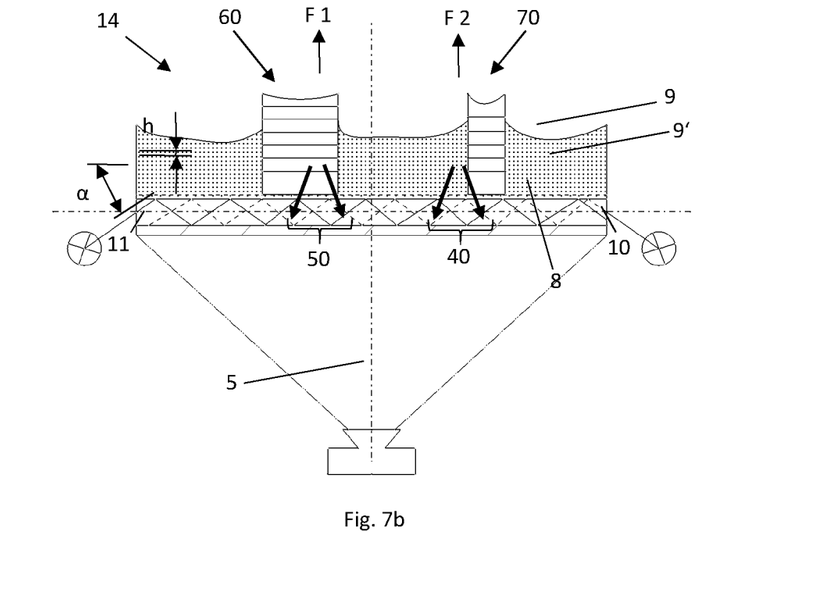
FIG. 7b a schematic diagram in which the intermediate phase has the height h, wherein h<H, and the measuring radiation is coupled out.

FIG. 7b shows—as FIG. 7a—a detailed section through the receiving space 14, wherein in said schematic diagram a case is represented in which the intermediate layer 9' has a thickness h. Here, h is smaller than H (h<H). In the represented schematic diagram also a possible borderline case is represented exemplarily, in which the intermediate layer 9' has dropped down to a limit value h, for instance by the consumption of the inhibitor or by process factors, so that measurable separation forces F1 and F2 occur for the first time. Thereby conclusions with regard to the fact where the borderline case of the intermediate layer thickness has been reached can be drawn, if applicable in a space-resolved and time-resolved manner, in order to initiate process-related steps, if necessary, in order to regenerate and/or actively recreate the intermediate layer 9'. This can for instance be carried out by an additional and/or increased supply of at least one inhibitor, by a change of an inhibitor concentration (for instance oxygen-enriched air), by a corresponding variation of the process factors like the exposure energy, waiting times, lifting speed, etc., and/or by a systematic introduction of pauses.

Said changes contribute individually or in combination to the increase of the height extension of the intermediate layer 9'. By means of the described measuring method, alterations of the intermediate layer 9', for instance by a systematic and space-resolved (local) supply of inhibitors, which will only be carried out in the region where the intermediate layer shall specifically be increased or regenerated, can also be detected in a space-resolved and time-resolved manner. Said systematic supply could also be carried out in dependence on the geometric extension of the body or in dependence on the exposure area. Thus, by the described measuring method the thickness of the intermediate layer 9' can be locally detected and increased in a systematic manner in dependence on the extension of the body to be produced.

What is claimed is:

1. A method for producing a three-dimensional body in a stereolithographic process, comprising:
    curing individual layers of a photosensitive material by a curing radiation to solidify the photosensitive material and form a cured body, the photosensitive material being proximate a reference layer and deforming the reference layer as curing progresses;
    emitting a passive measuring radiation into the reference layer during solidification of the photosensitive material and, as a result of internal reflection, a first portion of the measuring radiation is coupled into the reference layer, with a second portion of the measuring radiation emerging from the reference layer, wherein internal reflection changes as the emerging radiation is disturbed by the reference layer deforming, wherein the measuring radiation is infrared radiation having a first source and the curing radiation has a second source different from the first source;
    continuously and selectively detecting the emerging measuring radiation from the reference layer simultaneously in a plurality of measuring areas by a sensor as the body is produced;
    continuously monitoring production of the body based on the changes of reflection of the emerging measuring radiation disturbed from the reference layer deforming in the measuring areas proximate the formed body being detected; and
    separating the cured photosensitive material from the reference layer.

2. The method according to claim 1, wherein the reference layer is flexible and at least partially transparent for the measuring radiation.

3. The method according to claim 1, wherein the reference layer consists of silicone.

4. A method for producing a three-dimensional body in a stereolithographic process, comprising:
    curing a photosensitive material by radiation, the photosensitive materials being proximate a reference layer and deforming the reference layer as curing progresses:
    emitting measuring radiation into the reference layer, as a result of internal reflection, a first portion of the measuring radiation is coupled into the reference layer, with a second portion of the measuring radiation emerging from the reference layer, wherein the measuring radiation is infrared radiation having a first source and the curing radiation has a second source different from the first source;
    wherein reflection occurs within the reference layer and with the first portion of the measuring radiation remains remaining within the reference layer, wherein reflection changes as the emerging radiation is disturbed by the reference layer deforming as curing progresses:
    continuously and selectively detecting changes in the reflection of the emerging measuring radiation simultaneously in a plurality of measuring areas by a sensor; and separating the cured photosensitive material from the reference layer.

5. The method according to claim 1, wherein a camera is used as a sensor.

6. The method according to claim 1, wherein an IR detector which detects polymerization heat arising in the stereolithographic process is used as a sensor.

7. The method according to claim 1, wherein the sensor detects the emerging measuring radiation over an entire surface of the reference layer.

8. The method according to claim 1, wherein the sensor detects the emerging measuring radiation below the reference layer.

9. The method according to claim 1, wherein a CCD camera is used as a sensor.

10. The method according to claim 1, wherein the first portion of the measuring radiation is greater than the second portion of the measuring radiation.

11. The method according to claim 1, wherein reference layer comprises a reference layer having elasticity and wherein emitting measuring radiation comprises emitting measuring radiation into the reference layer.

12. The method according to claim 1, wherein detecting the emerging measuring radiation comprises detecting location dependent change of an intensity distribution of the measuring radiation over a period of time.

13. A method for producing a three-dimensional body in a stereolithographic process, comprising:

curing a photosensitive material by radiation to create a plurality of formed layers solidify the photosensitive material and form a cured body, the photosensitive materials being proximate a reference layer, wherein the reference layer deforms layer as curing progresses:

emitting measuring radiation into the reference layer, wherein as a result of internal reflection, a first portion of the measuring radiation is coupled into the reference layer, with a second portion of the measuring radiation emerging from the reference layer, wherein the first portion of the measuring radiation is greater than the second portion of the measuring radiation wherein reflection changes as the emerging radiation is disturbed by the reference layer deforming as curing progresses, wherein the measuring radiation is infrared radiation having a first source and the curing radiation has a second source different from the first source;

continuously and selectively detecting changes in the reflection of the emerging measuring radiation from being disturbed by the deformation of the reference layer as curing progresses, the detecting occurring simultaneously in a plurality of measuring areas by a sensor; and separating the cured photosensitive material from the reference layer.

* * * * *